(12) United States Patent
Miyata

(10) Patent No.: US 9,209,286 B2
(45) Date of Patent: Dec. 8, 2015

(54) SEMICONDUCTOR DEVICE

(71) Applicant: KABUSHIKI KAISHA TOSHIBA, Minato-ku, Tokyo (JP)

(72) Inventor: Toshitaka Miyata, Mie-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/078,172

(22) Filed: Nov. 12, 2013

(65) Prior Publication Data

US 2015/0060772 A1 Mar. 5, 2015

(30) Foreign Application Priority Data

Aug. 29, 2013 (JP) ................................ 2013-178453

(51) Int. Cl.
H01L 29/66 (2006.01)
H01L 29/739 (2006.01)
H01L 29/78 (2006.01)

(52) U.S. Cl.
CPC ...... *H01L 29/7391* (2013.01); *H01L 29/66356* (2013.01); *H01L 29/785* (2013.01)

(58) Field of Classification Search
CPC ............................................ H01L 29/66356
See application file for complete search history.

(56) References Cited

U.S. PATENT DOCUMENTS

| 7,893,476 | B2 | 2/2011 | Verhulst |
|---|---|---|---|
| 7,915,693 | B2 * | 3/2011 | Okano .......................... 257/401 |
| 8,026,509 | B2 | 9/2011 | Goel et al. |
| 8,120,115 | B2 | 2/2012 | Vandenberghe et al. |
| 8,404,545 | B2 | 3/2013 | Vandenberghe et al. |
| 8,859,379 | B2 * | 10/2014 | Cheng et al. ................... 438/301 |
| 2012/0228706 | A1 | 9/2012 | Sugizaki et al. |
| 2012/0298959 | A1 | 11/2012 | Verhulst et al. |
| 2013/0037823 | A1 * | 2/2013 | Kanemura et al. ............... 257/77 |
| 2013/0069128 | A1 * | 3/2013 | Okano .......................... 257/288 |
| 2014/0252475 | A1 * | 9/2014 | Xu ................................ 257/347 |
| 2014/0264277 | A1 * | 9/2014 | Doornbos et al. .............. 257/24 |

FOREIGN PATENT DOCUMENTS

JP 2012-182368 A 9/2012

OTHER PUBLICATIONS

S. W. Kim et al., "Design Guideline of Si-Based L-Shaped Tunneling Field-Effect Transistors", Japanese Journal of Applied Physics 51 (2012) 06FE09, 4 Pages (in English).
F. Mayer, et al., "Impact of SOI, Si1-xGexOI and GeOI substrates on CMOS compatible Tunnel FET performance", IEDM, 163 (2008), 5 Pages (in English).

* cited by examiner

*Primary Examiner* — Peniel M Gumedzoe
*Assistant Examiner* — Christopher Johnson
(74) *Attorney, Agent, or Firm* — Holtz, Holtz, Goodman & Chick PC

(57) ABSTRACT

According to one embodiment, the pair of semiconductor regions are provided respectively on a pair of side walls of the second semiconductor layer having the fin configuration to form tunnel junctions with the second semiconductor layer. The gate electrode is provided on two sides of the second semiconductor layer at the pair of side walls to oppose the tunnel junctions with the semiconductor regions interposed between the gate electrode and the tunnel junctions. The third semiconductor layer is separated from the second semiconductor layer and the semiconductor regions by the first semiconductor layer to be adjacent to the first semiconductor layer.

15 Claims, 11 Drawing Sheets

SEMICONDUCTOR DEVICE

CROSS-REFERENCE TO RELATED APPLICATION

This application is based upon and claims the benefit of priority from Japanese Patent Application No. 2013-178453, filed on Aug. 29, 2013; the entire contents of which are incorporated herein by reference.

FIELD

Embodiments described herein relate generally to a semiconductor device.

BACKGROUND

Although the basic elements of large-scale semiconductor integrated circuits are mainly MOSFETs (Metal-Oxide-Semiconductor Field Effect Transistors) in the current state of the art, it has become difficult to downscale MOSFETs to improve the performance, reduce the power consumption, etc.

Therefore, research and development is being conducted for tunnel FETs (Field Effect Transistors) that utilize the tunneling of electrons unlike the operation principle of MOSFETs.

DETAILED DESCRIPTION

Figure 1:
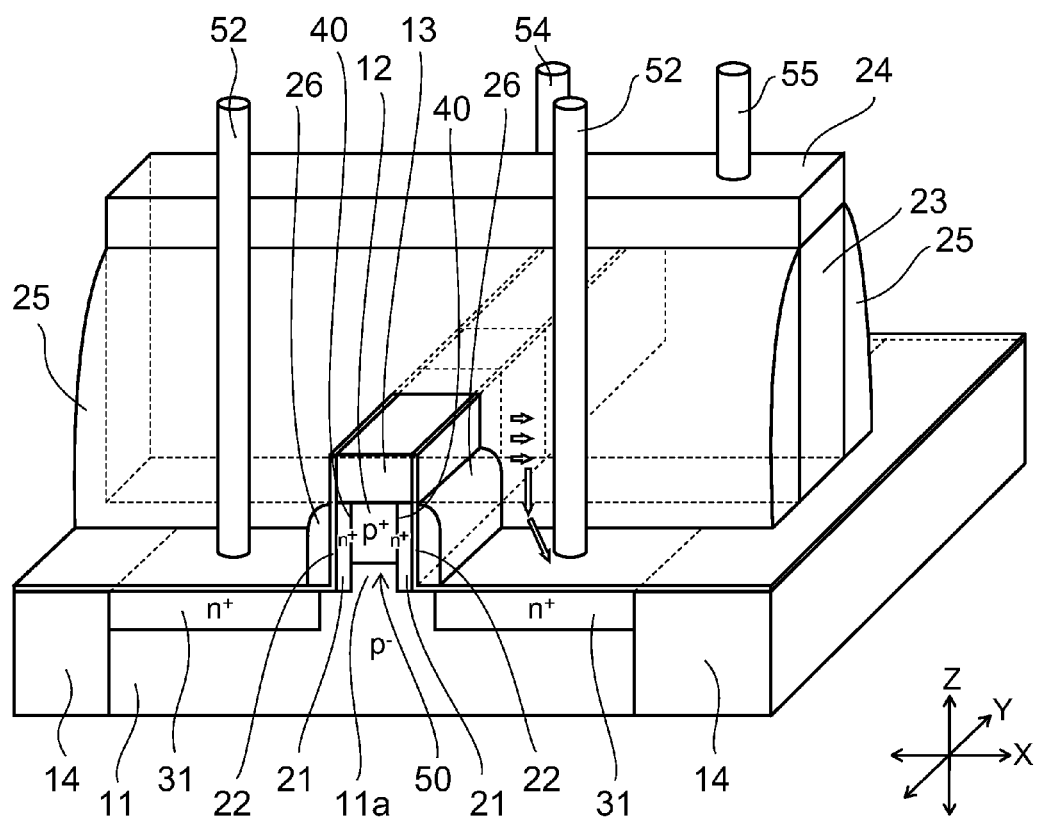
FIG. 1 is a schematic perspective view of a semiconductor device of an embodiment.

According to one embodiment, a semiconductor device includes a first semiconductor layer, a second semiconductor layer of a first conductivity type, a pair of semiconductor regions of a second conductivity type, a gate electrode, a gate insulating film, and a third semiconductor layer of the second conductivity type. The second semiconductor layer is provided in a fin configuration on the first semiconductor layer. An impurity concentration of the second semiconductor layer is higher than an impurity concentration of the first semiconductor layer. The pair of semiconductor regions are provided respectively on a pair of side walls of the second semiconductor layer having the fin configuration to form tunnel junctions with the second semiconductor layer. The gate electrode is provided on two sides of the second semiconductor layer at the pair of side walls to oppose the tunnel junctions with the semiconductor regions interposed between the gate electrode and the tunnel junctions. The gate insulating film is provided between the gate electrode and the semiconductor regions. The third semiconductor layer is separated from the second semiconductor layer and the semiconductor regions by the first semiconductor layer to be adjacent to the first semiconductor layer. An impurity concentration of the third semiconductor layer is higher than the impurity concentration of the first semiconductor layer.

Embodiments will now be described with reference to the drawings. Similar components in the drawings are marked with like reference numerals.

Although the first conductivity type is the p-type and the second conductivity type is the n-type in the description of the embodiments recited below, the embodiments also are implementable when the first conductivity type is the n-type and the second conductivity type is the p-type.

Although the semiconductor material in the description hereinbelow is illustrated as being silicon, the semiconductor material is not limited to silicon and may be, for example, silicon carbide, gallium nitride, etc.

FIG. 1 is a schematic perspective view of the semiconductor device of the embodiment.

In FIG. 1, two mutually orthogonal directions in a plane parallel to a major surface of a substrate are taken as an X-direction and a Y-direction; and a direction orthogonal to both the X-direction and the Y-direction is taken as a Z-direction.

Figure 2:
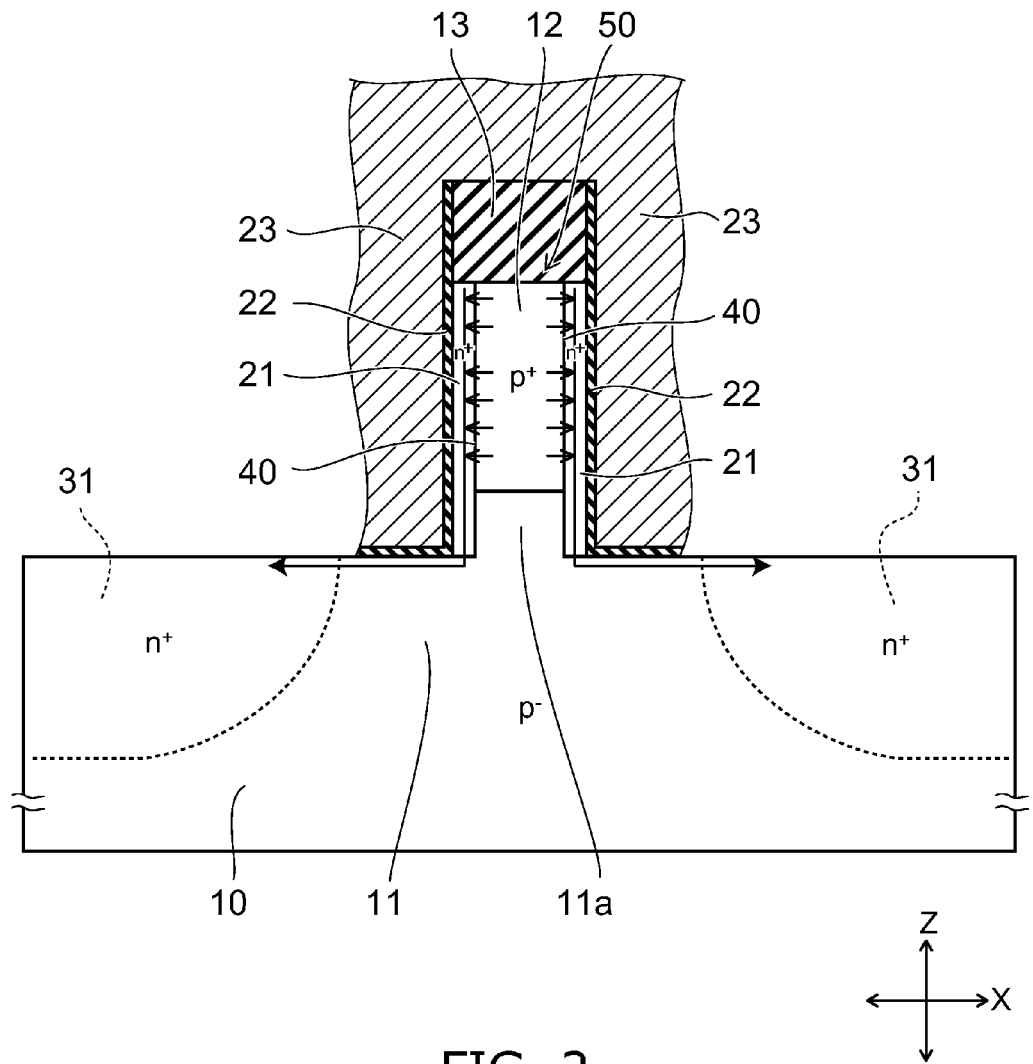
FIG. 2 is a schematic cross-sectional view of the semiconductor device of the embodiment.

FIG. 2 is a schematic cross-sectional view of the semiconductor device of the embodiment.

Figure 3A:
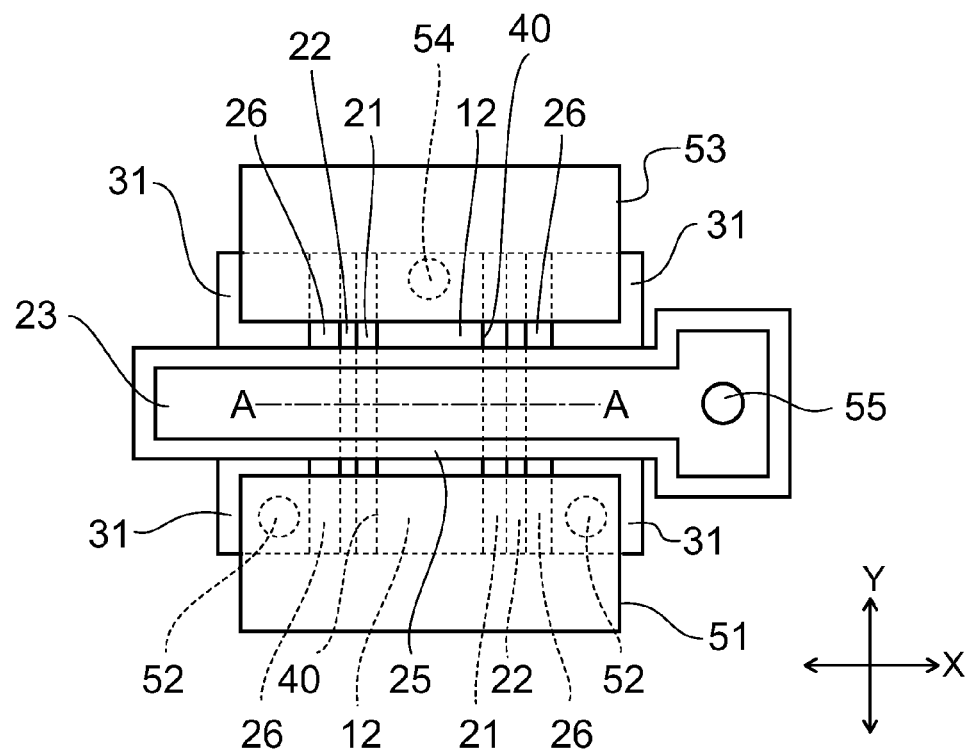
FIGS. 3A and 3B are schematic plan views of the semiconductor device of the embodiment.

FIG. 3A is a schematic plan view of the semiconductor device of the embodiment.

FIG. 2 corresponds to the A-A cross section of FIG. 3A. Namely, FIG. 2 corresponds to the X-Z cross section in the region of FIG. 1 where a gate electrode 23 is provided.

A semiconductor layer 11 of $p^-$-type silicon is provided as a first semiconductor layer on the front surface side of a substrate 10 (shown in FIG. 2). Or, the semiconductor layer 11 is provided as a portion of a $p^-$-type silicon substrate 10.

A protrusion 11a is provided at the upper surface of the semiconductor layer 11. The protrusion 11a extends in the Y-direction.

A source layer 12 of $p^+$-type silicon is provided as a second semiconductor layer on the protrusion 11a. The lower surface of the source layer 12 contacts the upper surface of the protrusion 11a.

The width (the width in the X-direction) of the source layer 12 is the same as the width (the width in the X-direction) of the protrusion 11a. The height (the height in the Z-direction) of the source layer 12 is higher than the height (the height in the Z-direction) of the protrusion 11a.

Although the source layer 12 and the semiconductor layer 11, which includes the protrusion 11a, have the same conductivity type (the p-type), the p-type impurity concentration of the source layer 12 is higher than the p-type impurity concentration of the semiconductor layer 11.

The source layer 12 is provided in a fin configuration extending along the Y-direction. For the source layer 12, the ratio of the height (the height in the Z-direction) to the width (the width in the X-direction) is greater than 1. In other words, the width of the source layer 12 is smaller than the height of the source layer 12. Also, the length of the source layer 12 in the Y-direction is greater than the width and the height of the source layer 12.

The source layer 12 which has the fin configuration includes a pair of side walls extending along the Y-direction. A pair of semiconductor films (semiconductor regions) 21 of $n^+$-type silicon is provided respectively on the pair of side walls. The semiconductor films 21 are provided on the entire surfaces of the side walls of the source layer 12. The n-type impurity concentration of the semiconductor films 21 is higher than the p-type impurity concentration of the semiconductor layer 11.

The source layer 12 has p-n junctions with the semiconductor films 21; and the p-n junctions form tunnel junctions (surfaces) 40. A tunneling current flows in the tunnel junctions 40 due to modulation of the potential barrier by a gate potential in the state in which a reverse bias is applied to the tunnel junctions 40.

The tunnel junctions 40 are regions having the same surface areas as the side walls of the source layer 12 and are formed in regions having rectangular configurations extending in the Z-direction and the Y-direction.

The source layer 12 is a monocrystalline layer of $p^+$-type silicon; and the semiconductor films 21 are monocrystalline films of $n^+$-type silicon. Accordingly, the tunnel junctions 40 are formed to have monocrystalline structures having few defects to trap electrons; and a tunneling current leakage through a defect can be reduced.

The semiconductor films 21 extend from the side walls of the source layer 12 to the side walls of the protrusion 11a. In other words, the semiconductor films 21 have p-n junctions with the side walls of the protrusion 11a.

The lower ends (the lower surfaces) of the semiconductor films 21 contact the upper surface of the semiconductor layer 11 continuing from the side walls of the protrusion 11a. In other words, the lower ends of the semiconductor films 21 also have p-n junctions with the semiconductor layer 11.

The semiconductor films 21 are not provided on the upper surface of the source layer 12; and an insulating layer 13 is provided on the upper surface of the source layer 12. The insulating layer 13 is, for example, a silicon nitride layer. The lower surface of the insulating layer 13 contacts the upper surface of the source layer 12.

The upper surfaces of the semiconductor films 21 are formed at the same height as the upper surface of the source layer 12; and the insulating layer 13 is provided also on the upper surfaces of the semiconductor films 21. The upper surface of the source layer 12 and the upper surfaces of the semiconductor films 21 are covered with the insulating layer 13.

The semiconductor films 21 are not provided on the upper surface and lower surface of the source layer 12. Accordingly, the tunnel junctions 40 are formed at only the side walls of the source layer 12 without being formed at the upper surface and lower surface of the source layer 12.

A drain layer 31 of $n^+$-type silicon is provided as a third semiconductor layer on the front surface side of the semiconductor layer 11 in a region on two sides of the protrusion 11a in the X-direction. The n-type impurity concentration of the drain layer 31 is higher than the p-type impurity concentration of the semiconductor layer 11.

The drain layer 31 is separated from the semiconductor films 21 and the source layer 12 by the semiconductor layer 11. The drain layer 31 is proximal to the region of the semiconductor layer 11 under the protrusion 11a. The lower surface of the drain layer 31 and the end portion of the drain layer 31 on the protrusion 11a side have p-n junctions with the semiconductor layer 11.

A p-n diode is formed of the source layer 12, the semiconductor layer 11, and the drain layer 31. In the semiconductor device of the embodiment, a state in which a reverse bias is applied to the p-n diode is realized by applying a relatively high potential to the drain layer 31 and a relatively low potential to the source layer 12. At this time, the current between the drain layer 31 and the source layer 12 does not flow if a tunneling current is not generated at the tunnel junctions 40 by the control of the gate potential. In other words, the semiconductor device of the embodiment is in the off-state.

Or, the semiconductor layer 11 may be an intrinsic semiconductor; and in such a case, a p-i-n diode is formed of the source layer 12, the semiconductor layer 11, and the drain layer 31.

A gate insulating film 22 is provided on the side surfaces of the semiconductor films 21, on the side surface of the insulating layer 13, on the upper surface of the semiconductor layer 11, and on the upper surface of the drain layer 31. The gate insulating film 22 is, for example, a silicon oxide film.

The source layer 12 which has the fin configuration extends in the Y-direction on the semiconductor layer 11. The gate electrode 23 is provided on the semiconductor layer 11 to intersect the source layer 12 extending in the Y-direction. The gate electrode 23 extends in the width direction of the source layer 12 (the X-direction) to cross the source layer 12. The width (the width in the X-direction) of the source layer 12 is narrower than the width (the width in the Y-direction) of the gate electrode 23.

An insulating layer 24 is provided on the upper surface of the gate electrode 23. The insulating layer 24 is, for example, a silicon nitride layer. Also, sidewall insulating films 25 are provided on two side walls of the gate electrode 23 on two sides of the gate electrode 23 in the Y-direction. The sidewall insulating films 25 are, for example, silicon nitride films.

At the portion where the gate electrode 23 intersects the source layer 12, the gate electrode 23 is provided along the side walls and upper surface of a fin structure unit 50 that includes the source layer 12 as shown in FIG. 2.

The gate electrode 23 is provided at two sides of the source layer 12 at the pair of side walls to oppose the tunnel junctions 40 with the gate insulating film 22 and the semiconductor films 21 interposed between the gate electrode 23 and the source layer 12.

The gate insulating film 22 is provided between the gate electrode 23 and the side surfaces of the semiconductor films 21, between the gate electrode 23 and the semiconductor layer 11, and between the gate electrode 23 and the drain layer 31.

As shown in FIG. 1, sidewall insulating films 26 are provided at the side surfaces of the gate insulating film 22 at portions of the fin structure unit 50 not covered with the gate electrode 23 and the sidewall insulating films 25. The sidewall insulating films 26 are, for example, silicon nitride films.

The drain layer 31 is provided in a region that does not overlap the gate electrode 23, the sidewall insulating films 25, the fin structure unit 50, and the sidewall insulating films 26, is on two sides of the fin structure unit 50 in the X-direction, and is on two sides of the gate electrode 23 in the Y-direction.

The drain layer 31 is formed to be self-aligned by ion implantation using the insulating layer 24 on the gate electrode 23, the sidewall insulating films 25, the insulating layer 13 of the fin structure unit 50, and the sidewall insulating films 26 as a mask. Accordingly, the drain layer 31 is not provided under the gate electrode 23 and under the fin structure unit 50.

A contact plug 52 of the drain layer 31 is provided on the region not overlapping the gate electrode 23 and the fin structure unit 50. The contact plug 52 pierces the gate insulating film 22 to contact the drain layer 31.

A drain electrode layer 51 shown in FIG. 3A is provided in a layer on the contact plug 52. The drain layer 31 is electrically connected to the drain electrode layer 51 via the contact plug 52.

A contact plug 54 is provided on a region of the fin structure unit 50 not intersected by the gate electrode 23. The contact plug 54 pierces the insulating layer 13 to contact the source layer 12.

A source electrode layer 53 shown in FIG. 3A is provided in a layer on the contact plug 54. The source layer 12 is electrically connected to the source electrode layer 53 via the contact plug 54.

The drain layer 31 is not formed under the gate electrode 23. Accordingly, the drain layer 31 that is provided on two sides of the gate electrode 23 in the Y-direction is not connected under the gate electrode 23. Therefore, in the region where the source electrode layer 53 is provided as well, the drain layer 31 under the region where the source electrode layer 53 is provided, is connected to the drain electrode layer 51 via the contact plug 52. In other words, the drain electrode layer 51 overlaps the source electrode layer 53 over or under the source electrode layer 53 with a not-shown inter-layer insulating layer interposed.

A contact plug 55 is provided on the region of the gate electrode 23 not intersected by the fin structure unit 50. The contact plug 55 pierces the insulating layer 24 to contact the gate electrode 23. The gate electrode 23 is electrically connected to a not-shown gate interconnect via the contact plug 55.

Figure 3B:
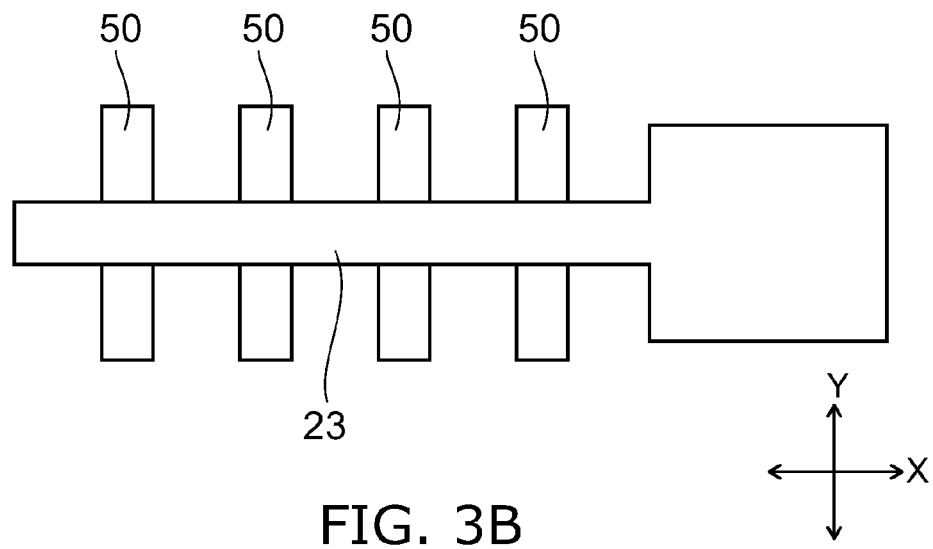

FIG. 3B is a schematic plan view showing the planar layout of the gate electrode 23 and the fin structure units 50.

As shown in FIG. 3B, multiple fin structure units 50 intersect one gate electrode 23 extending in the X-direction. In other words, multiple source layers 12 intersect one gate electrode 23.

The semiconductor layer 11 and the drain layer 31 are separated in the X-direction by an insulating separation film 14 shown in FIG. 1 in the regions between the fin structure units 50 adjacent to each other in the X-direction. The insulating separation film 14 is formed around one element region including one fin structure unit 50.

In the semiconductor device of the embodiment described above, a potential is applied to the source layer 12 and the drain layer 31 to apply a reverse bias to the tunnel junctions 40 formed of the p-n junctions between the source layer 12 and the semiconductor films 21. For example, a positive potential is applied to the drain layer 31; and a potential of 0 V is applied to the source layer 12.

Figure 4A:
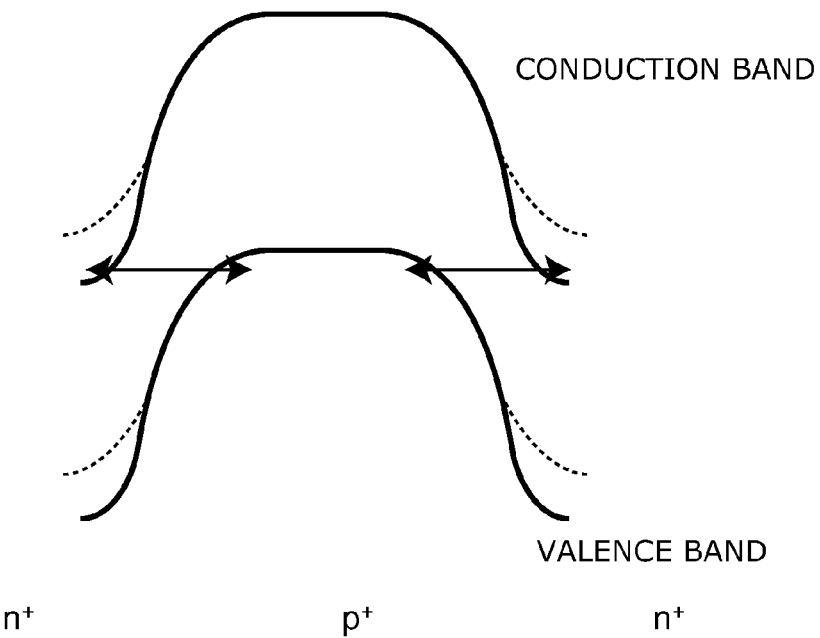
FIGS. 4A and 4B are energy band diagrams of the electrons of p-n junctions.

FIG. 4A is an energy band diagram of the electrons of the p$^+$-type source layer 12 and the tunnel junctions 40. The reverse bias is applied to the tunnel junctions 40.

At a p-n junction that has a high impurity concentration, the potential barrier becomes thin in the reverse bias state; and the electrons exceed the potential barrier due to the tunneling and pass from the p$^+$-type source layer 12 into the n$^+$-type semiconductor film 21.

The barrier width can be changed by the control of the gate potential applied to the gate electrode 23 opposing the tunnel junction 40 with the gate insulating film 22 interposed.

The energy bands of the tunnel junction 40 in the off-state are illustrated by the broken lines in FIG. 4A. At this time, the gate potential is 0 V. In other words, the semiconductor device of the embodiment is normally-off.

When a potential that is the threshold or higher is applied to the gate electrode 23, the energy bands of the tunnel junction 40 are modulated from the broken lines to the solid lines shown in FIG. 4A due to the effect of the electric field from the gate electrode 23; and the barrier width becomes small. Therefore, a tunneling current flows in the tunnel junctions 40 at the portions opposed by the gate electrode 23.

The electrons that pass from the source layer 12 to the semiconductor films 21 due to the tunneling flow into the drain layer 31 via the semiconductor films 21 and the semiconductor layer 11 as illustrated by the arrows in FIG. 1 and FIG. 2.

Although the conductivity type of the path (the semiconductor layer 11) between the semiconductor films 21 and the drain layer 31 is the reverse of that of the semiconductor films 21 and the drain layer 31, the semiconductor layer 11 between the semiconductor films 21 and the drain layer 31 is not a barrier that impedes the movement of the tunneling electrons because the impurity concentration of the semiconductor layer 11 is lower than that of the semiconductor films 21 and the drain layer 31.

In the tunnel FET, compared to a MOSFET, the current diffusion in the off-state is suppressed; and abrupt switching (the rise/fall of the current) is possible. In other words, an abrupt sub-threshold swing is obtained.

The abrupt sub-threshold swing realizes a high on-state current and a low off-state current at a constant power supply voltage. This makes it possible to reduce the voltage of the element and reduce the power consumption of the integrated circuit that uses the element.

Further, according to the embodiment, the on-state current can be increased while suppressing the increase of the chip surface area because the tunneling current can be generated over the entire surfaces of the side walls of the source layer 12 having the fin configuration.

Although providing the tunnel junctions 40 with a high impurity concentration can provide an abrupt sub-threshold swing, there are cases where the threshold is undesirably too low.

Therefore, according to the embodiment, it is possible to control the threshold by the control of the width (the width in the X-direction) of the source layer 12 having the fin configuration without changing the impurity concentration profile of the tunnel junctions 40.

Figure 4B:
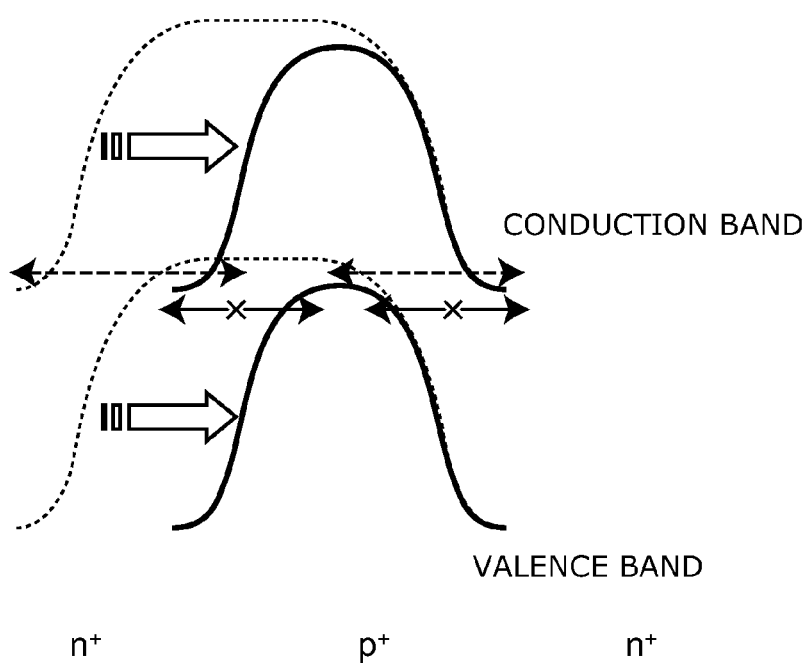

FIG. 4B is an energy band diagram of the electrons of the p$^+$-type source layer 12 and the tunnel junctions 40. The reverse bias is applied to the tunnel junctions 40.

In FIG. 4B, the broken lines illustrate the energy bands when the width of the source layer 12 is a first width; and the solid lines illustrate the energy bands when the width of the source layer 12 is a second width that is narrower than the first width. The same potential Vg is applied to the gate electrode 23 for both the first width and the second width.

When the width of the source layer 12 is the first width, due to the gate potential Vg, the barrier width of the tunnel junctions 40 decreases; a tunneling current is generated; and the state is switched to the on-state.

Conversely, when the width of the source layer 12 is the second width that is narrower than the first width, the electric field of the gate electrode 23 opposing one side wall of the source layer 12 and the electric field of the gate electrode 23 opposing the other side wall of the source layer 12 affect each other; the gate potential strongly affects the entire source layer 12; and the energy band of the source layer 12 is modulated.

In the case of the p$^+$-type source layer 12, the top of the conduction band and the top of the valence band are lower for the first width. Therefore, although the gate potential Vg for the second width is the same as for the first width, the barrier width is wider for the second width than for the first width; the tunneling current is not generated; and the state is switched to the off-state. Therefore, the threshold can be increased by reducing the width of the source layer 12 such that the potentials of the gate electrode 23 that act from the two side walls affect each other.

According to a simulation, the electric field of the gate electrode 23 on the two sides of the source layer 12 in the width direction strongly affects the source layer 12 when the width of the source layer 12 is not more than 20 nm; and the effect of increasing the threshold is obtained.

It is unnecessary to change the impurity concentration profiles of the tunnel junctions 40 to control the threshold. Therefore, the threshold can be controlled easily by the width control of the source layer 12 having the fin configuration while maintaining the abrupt sub-threshold swing.

A method for manufacturing the semiconductor device of the embodiment will now be described with reference to FIG. 5A to FIG. 10B.

Figure 5A:
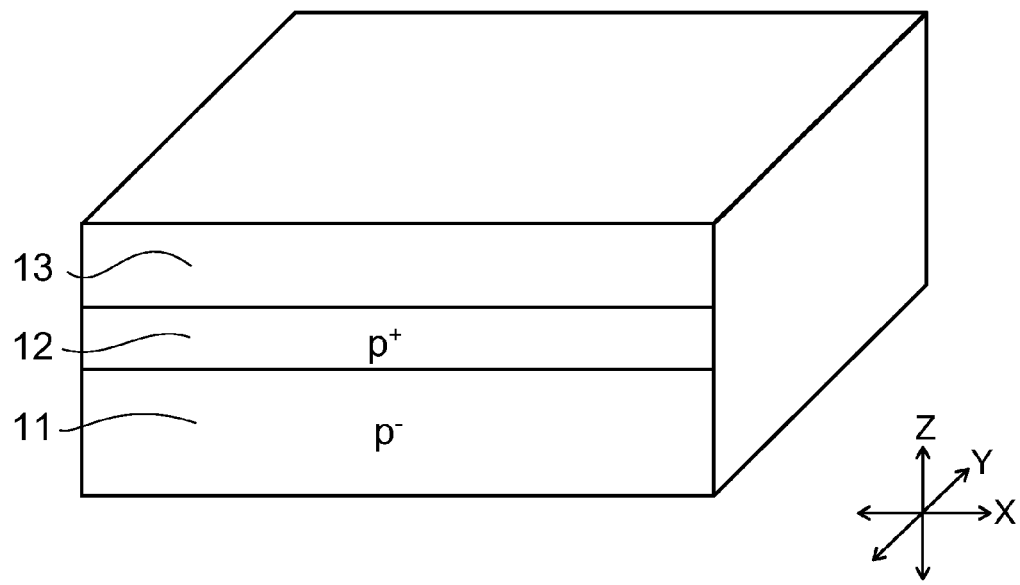
FIG. 5A to FIG. 9B are schematic perspective views showing a method for manufacturing the semiconductor device of the embodiment.

As shown in FIG. 5A, the p$^+$ source layer 12 is formed on the p$^-$-type semiconductor layer 11 as a silicon layer including, for example, boron as an impurity. The semiconductor layer 11 is a p$^-$-type silicon substrate or a p$^-$-type silicon layer formed on a substrate.

The source layer 12 is deposited to stack on the entire surface of the semiconductor layer 11 by, for example, CVD (Chemical Vapor Deposition) and subsequently is monocrystallinized by solid phase epitaxy.

For example, the p-type impurity concentration of the source layer 12 is $1 \times 10^{19}$/cm$^3$; and the thickness of the source layer 12 is 50 nm.

The insulating layer 13 is formed on the source layer 12 by, for example, CVD. The insulating layer 13 functions as a mask layer when, for example, the source layer 12 is patterned, etc. The insulating layer 13 is, for example, a silicon nitride layer having a thickness of 50 nm.

Then, a trench is made in the periphery of the stacked body shown in FIG. 5A by, for example, RIE (Reactive Ion Etching); and subsequently, the insulating separation film 14 is buried into the trench by CVD.

Figure 5B:
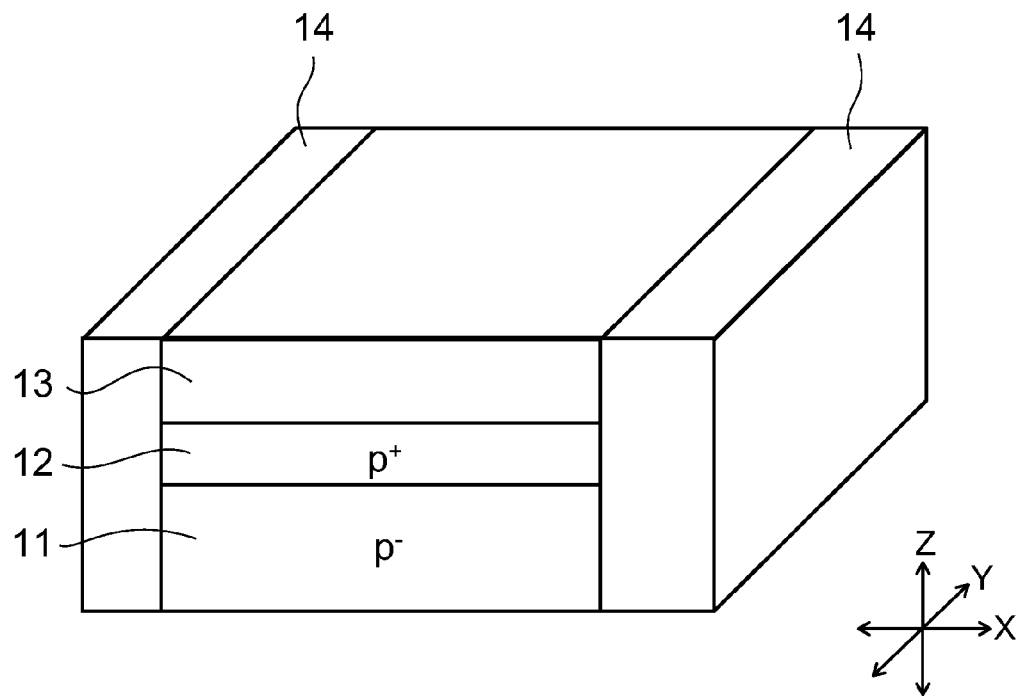

The insulating separation film 14 is, for example, a silicon oxide film. The insulating separation film 14 also is deposited on the insulating layer 13; and the upper surface of the insulating separation film 14 is planarized as shown in FIG. 5B by CMP (Chemical Mechanical Polishing) using the insulating layer 13 as a stopper.

Figure 6A:
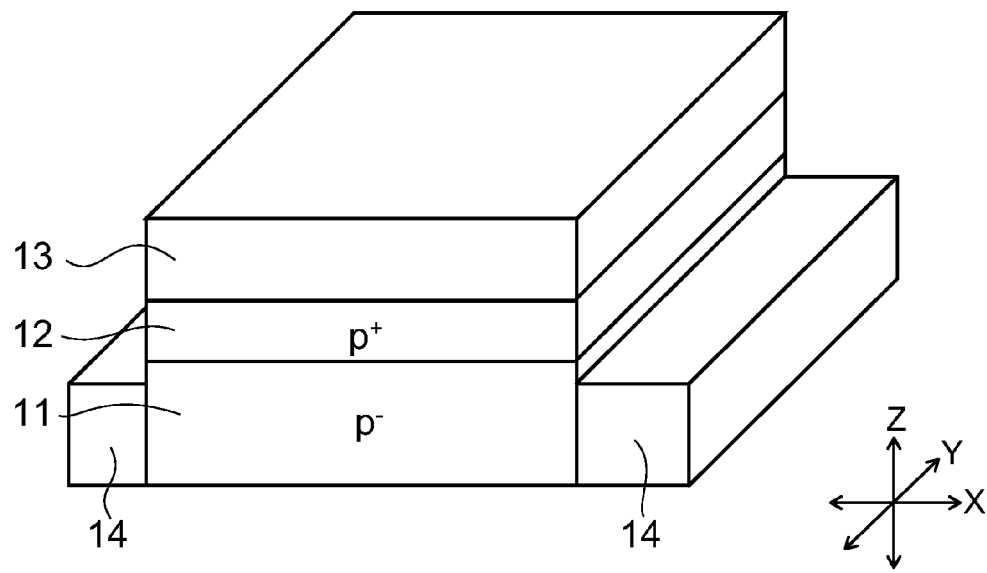

Then, as shown in FIG. 6A, etch-back of the insulating separation film 14 is performed by, for example, RIE. The upper surface of the insulating separation film 14 recedes toward the semiconductor layer 11 side to be lower than the lower surface of the source layer 12.

Figure 10A:
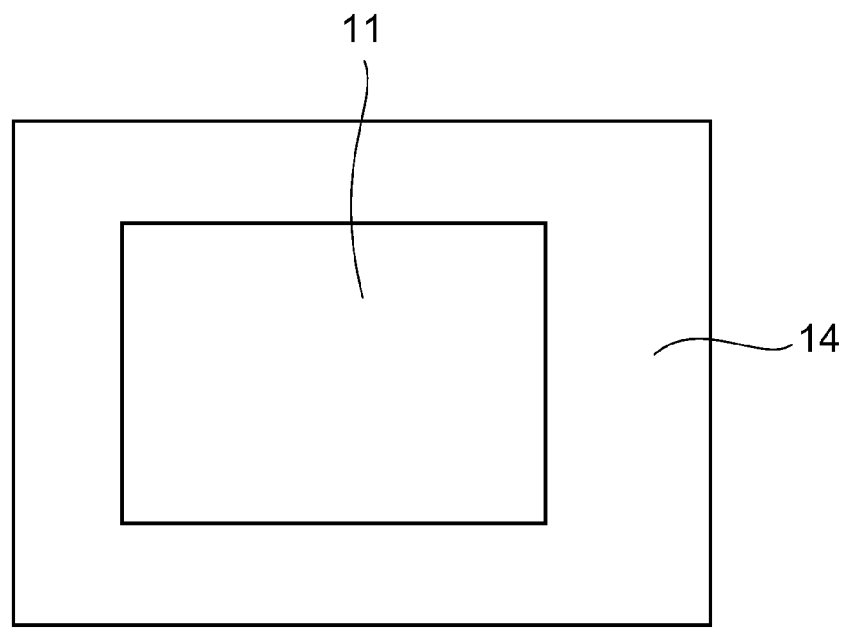
FIGS. 10A and 10B are schematic plan views showing the method for manufacturing the semiconductor device of the embodiment.

FIG. 10A is a schematic plan view showing the arrangement of the semiconductor layer 11 and the insulating separation film 14. The insulating separation film 14 is formed around the semiconductor layer 11 to have a STI (Shallow Trench Isolation) structure. The insulating separation film 14 is provided around the region where the semiconductor layer 11 is formed.

Figure 6B:
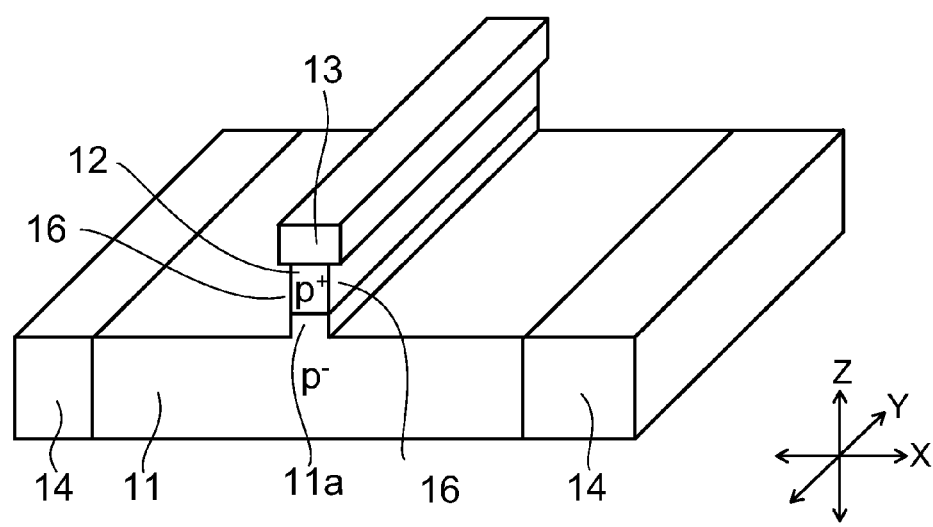

Then, the insulating layer 13 is patterned using a not-shown resist film. As shown in FIG. 6B, the insulating layer 13 is patterned into a line pattern extending in the Y-direction.

Continuing, the source layer 12 is patterned by RIE using the insulating layer 13 as a mask. The source layer 12 is processed into a fin configuration extending in the Y-direction.

Also, the front surface side of the semiconductor layer 11 is etched to form the protrusion 11a of the semiconductor layer 11 under the source layer 12.

Subsequently, the side walls of the source layer 12 are etched by wet etching with the insulating layer 13 remaining on the source layer 12. The upper surface of the semiconductor layer 11 and the side walls of the protrusion 11a also are etched. Slimming of the source layer 12 in the width direction (the X-direction) is performed; and spaces 16 are made under the insulating layer 13 adjacent to the side walls of the source layer 12.

Figure 7A:
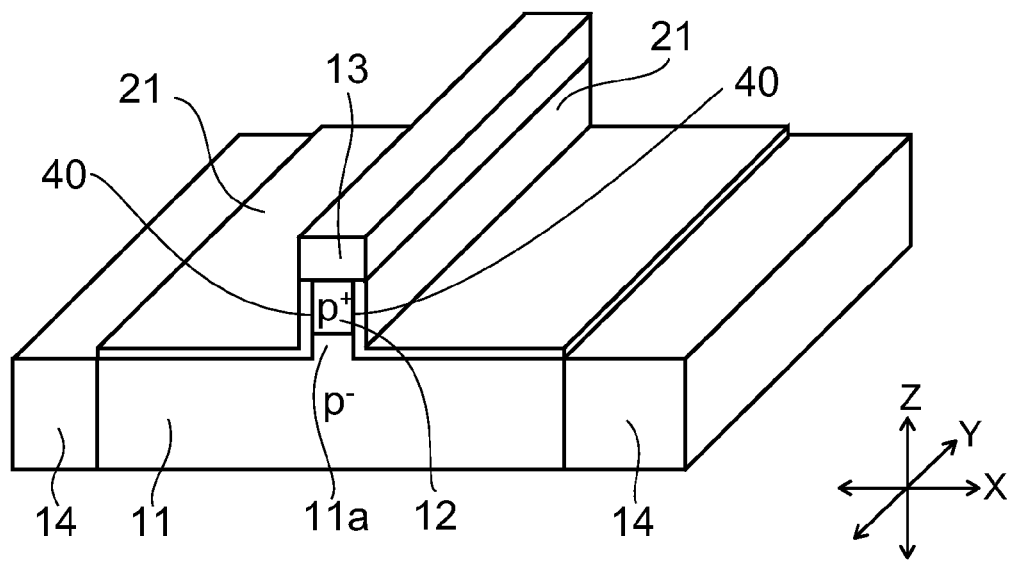

The widths of the spaces 16 are controlled to be substantially the same as the film thicknesses of the semiconductor films 21 shown in FIG. 7A that are formed in the spaces 16 in the next process. The film thicknesses of the semiconductor films 21 are, for example, 5 nm.

The semiconductor films 21 are deposited as n$^+$-type silicon films including, for example, arsenic as an impurity on the upper surface of the semiconductor layer 11, on the side walls of the protrusion 11a of the semiconductor layer 11, and at the side walls of the source layer 12 and are subsequently monocrystallinized by solid phase epitaxy.

Figure 7B:
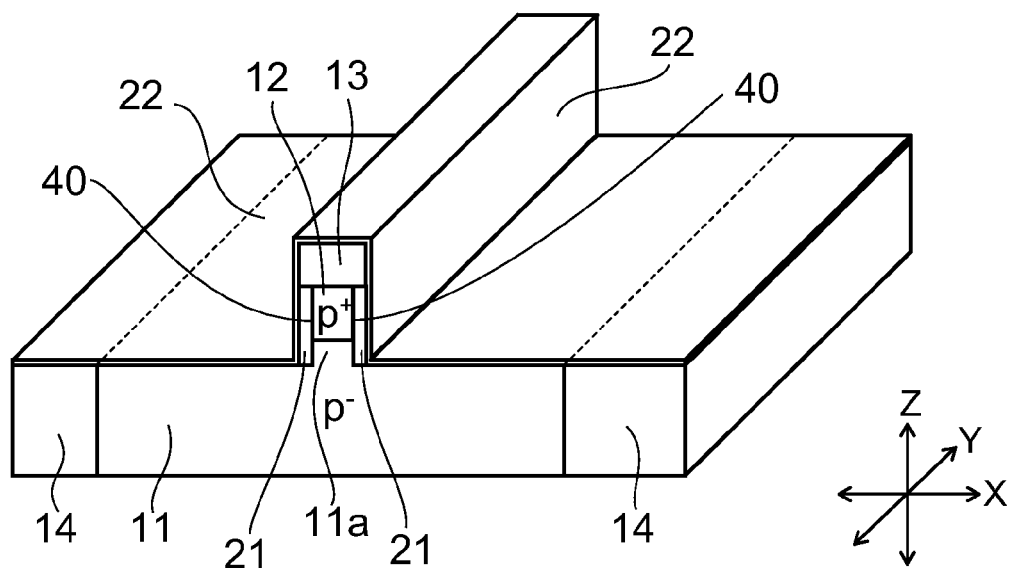

The semiconductor films 21 on the upper surface of the semiconductor layer 11 are removed by, for example, RIE. Subsequently, as shown in FIG. 7B, the gate insulating film 22 having a film thickness of 2 nm is formed by, for example, thermal oxidation.

The gate insulating film 22 is formed on the upper surface of the semiconductor layer 11, on the side surfaces of the semiconductor films 21, on the side surfaces of the insulating layer 13, and on the upper surface of the insulating layer 13.

Figure 8A:
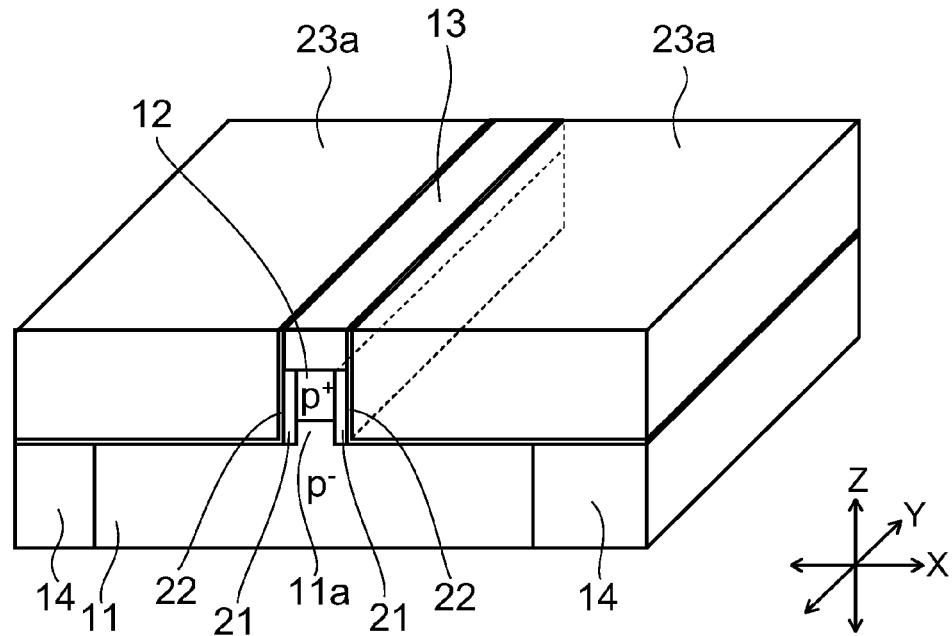

Then, a polycrystalline silicon layer 23a shown in FIG. 8A is deposited by, for example, low-pressure CVD on the structural body shown in FIG. 7B; and subsequently, the upper surface of the polycrystalline silicon layer 23a is planarized by CMP. The upper surface of the polycrystalline silicon layer 23a recedes to the height of the upper surface of the insulating layer 13. There are cases where the gate insulating film 22 on the upper surface of the insulating layer 13 may be removed; and the gate insulating film 22 on the upper surface of the insulating layer 13 may remain.

Then, a polycrystalline silicon layer 23b (shown in FIG. 8B) is deposited on the planarized polycrystalline silicon layer 23a by low-pressure CVD. The polycrystalline silicon layer 23b is deposited on the entire surface of the structural body shown in FIG. 8A.

The insulating layer 24 is deposited by CVD on the polycrystalline silicon layer 23b. After depositing the insulating layer 24 on the entire surface of the polycrystalline silicon layer 23b, the insulating layer 24 is patterned using a resist film.

Figure 8B:
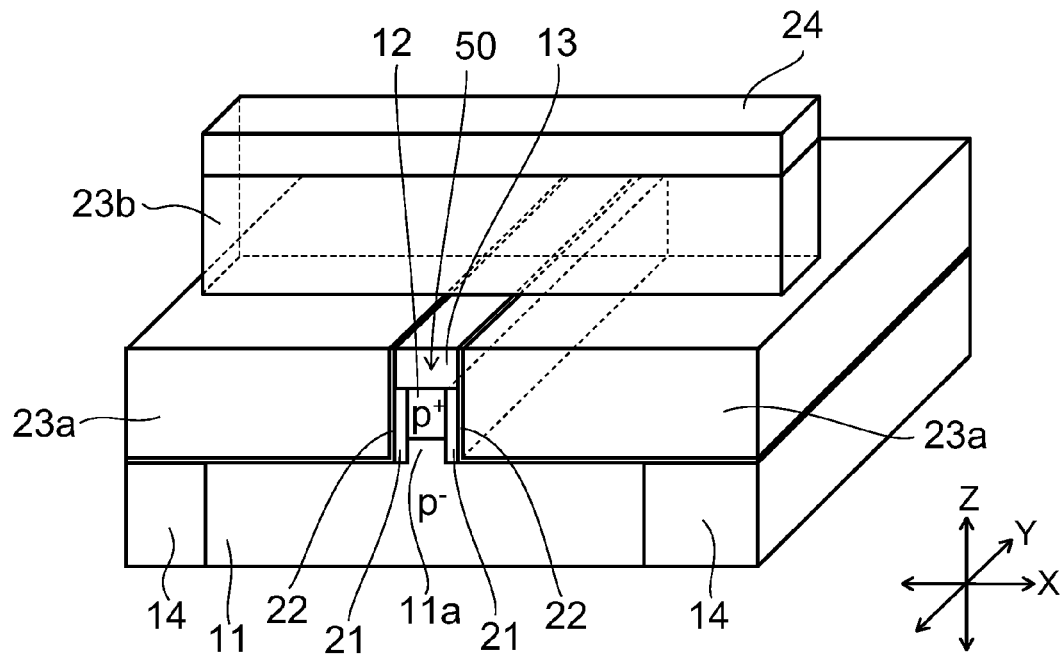

As shown in FIG. 8B, the insulating layer 24 is patterned into a line pattern extending in the X-direction. Then, the polycrystalline silicon layer 23b is patterned by RIE using the insulating layer 24 as a mask layer. Similarly to the insulating layer 24, the polycrystalline silicon layer 23b extends in the X-direction to intersect the source layer 12 extending in the Y-direction.

Then, anisotropic etching of the polycrystalline silicon layers 23b and 23a by RIE is performed at conditions having etching selectivity for the insulating layer 24 on the polycrystalline silicon layer 23b, the insulating layer 13 of the fin structure unit 50 that includes the source layer 12, and the gate insulating film 22.

Figure 9A:
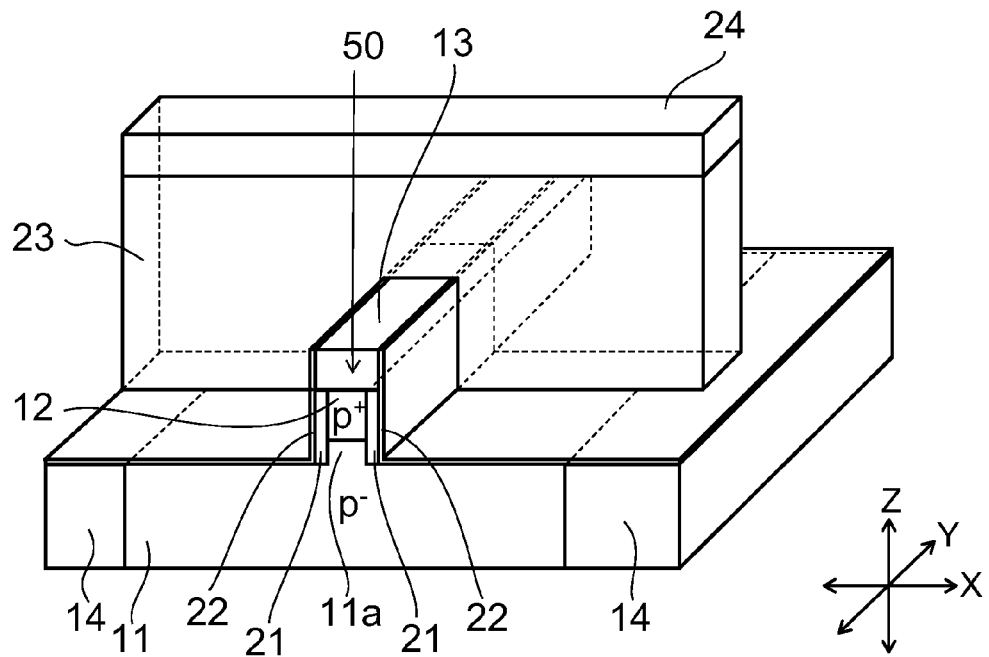

By the etching as shown in FIG. 9A, a polycrystalline silicon layer that extends in the X-direction to cross the fin structure unit 50 remains as the gate electrode 23. At the portion where the gate electrode 23 intersects the fin structure unit 50, the gate electrode 23 covers the side walls and upper surface of the fin structure unit 50 without a gap.

Figure 9B:
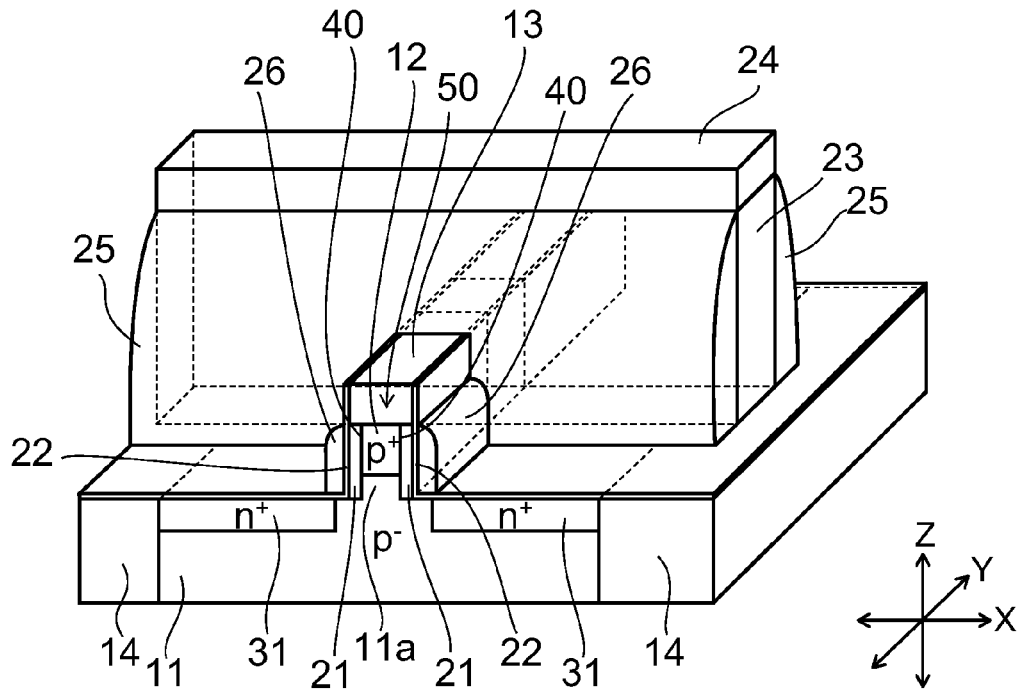

Then, as shown in FIG. 9B, the sidewall insulating films 25 are formed on the side walls of the gate electrode 23; and the sidewall insulating films 26 are formed on the side surfaces of the gate insulating film 22 formed on the side walls of the fin structure unit 50.

Continuing, for example, phosphorus is implanted as an impurity into the front surface of the semiconductor layer 11 by ion implantation with an energy of 4 keV and a dose of $1 \times 10^{15}$/cm$^2$ using the insulating layer 24, the sidewall insulating films 25, the insulating layer 13, and the sidewall insulating films 26 as a mask.

By the ion implantation, the n$^+$-type drain layer 31 is formed to be self-aligned in a region around the intersection between the gate electrode 23 and the fin structure unit 50 partitioned by the gate electrode 23 and the fin structure unit 50. Therefore, the alignment precision of the drain layer 31 with respect to the source layer 12 can be high.

Figure 10B:
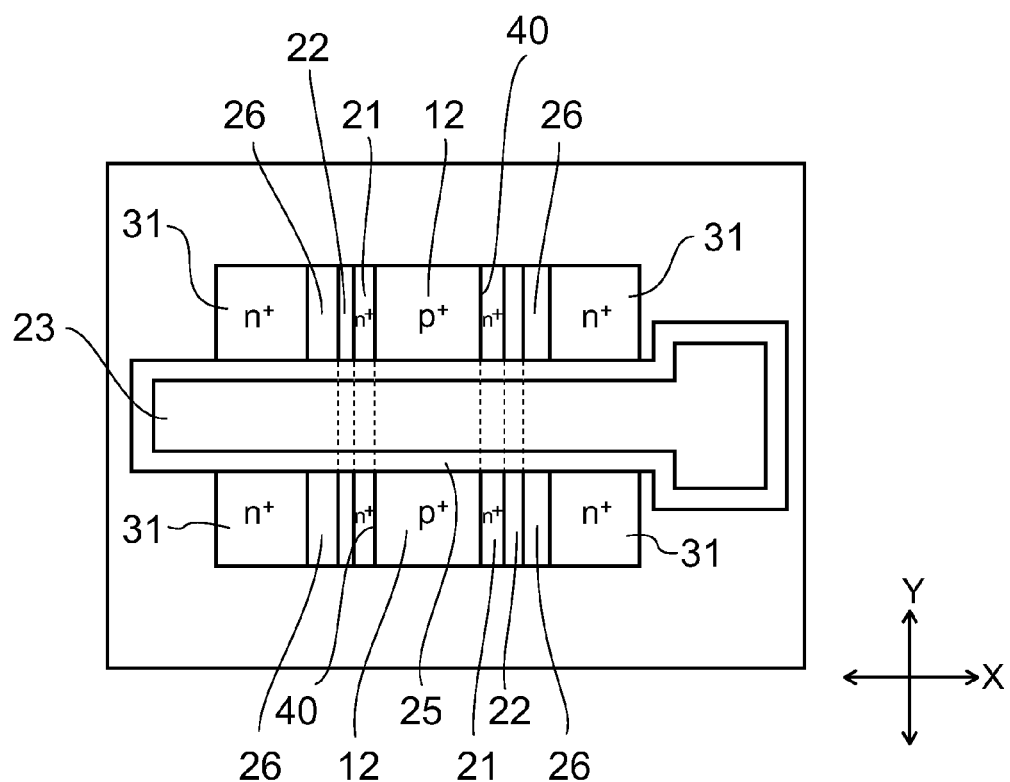

FIG. 10B corresponds to the top view of FIG. 9B.

The drain layer 31 is not formed under the gate electrode 23. The drain layer 31 is disposed symmetrically on two sides of the source layer 12 in the X-direction in a region not overlapping the gate electrode 23.

Subsequently, as shown in FIG. 1 and FIG. 3A, the contact plugs 52, 54, and 55, the drain electrode layer 51, the source electrode layer 53, etc., are formed.

In the embodiment described above, after patterning the source layer 12 into the fin configuration, slimming of the source layer 12 is performed with the insulating layer (the mask layer) 13 remaining as shown in FIG. 6B. Therefore, a structure is possible in which the upper surfaces of the semiconductor films 21 that are formed on the side walls of the source layer 12 also are covered with the insulating layer 13 as shown in FIG. 7A.

Figure 11:
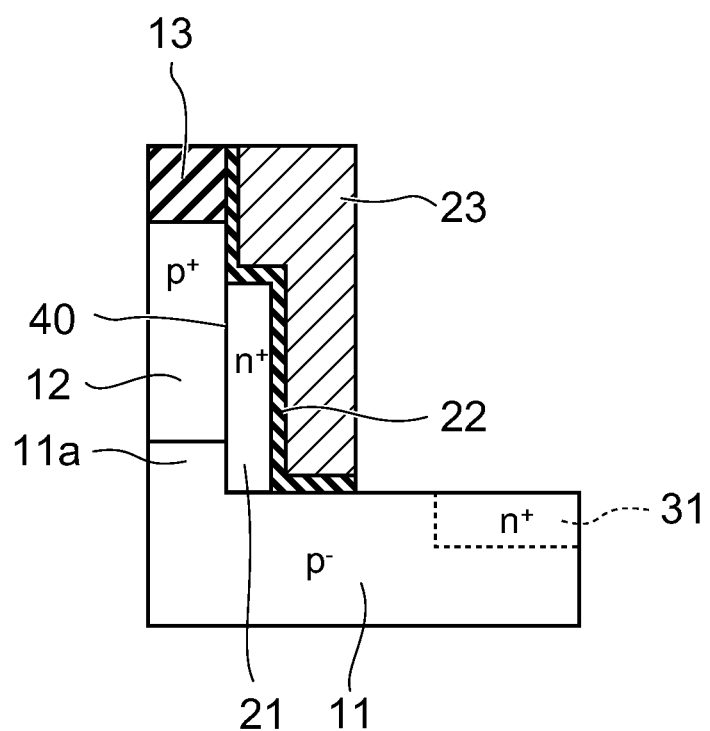
FIG. 11 is a schematic cross-sectional view of a modification of the semiconductor device of the embodiment.

Accordingly, the upper surfaces (the upper ends) of the semiconductor films 21 that are formed on the side walls of the source layer 12 can be prevented from receding due to the etching as shown in FIG. 11 when the semiconductor films 21 that are deposited on the upper surface of the semiconductor layer 11 are removed by RIE.

Therefore, the tunnel junctions 40 with the semiconductor films 21 can be formed at the entire surfaces of the side walls of the source layer 12. Accordingly, the tunneling current can be generated at the entire surfaces of the side walls of the source layer 12; and the increase of the on-state current can be realized.

In the case of the structure of FIG. 11, it is possible to reduce the cost by reducing the number of processes because the slimming after patterning the source layer 12 into the fin configuration is unnecessary.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a first semiconductor layer;
a second semiconductor layer of a first conductivity type provided in a fin configuration on the first semiconductor layer, an impurity concentration of the second semiconductor layer being higher than an impurity concentration of the first semiconductor layer;
a pair of semiconductor regions of a second conductivity type provided respectively on a pair of side walls of the second semiconductor layer having the fin configuration to form tunnel junctions with the second semiconductor layer;
a gate electrode provided on two sides of the second semiconductor layer at the pair of side walls to oppose the tunnel junctions with the pair of semiconductor regions interposed between the gate electrode and the tunnel junctions;
a gate insulating film provided between the gate electrode and the pair of semiconductor regions; and
a third semiconductor layer of the second conductivity type separated from the second semiconductor layer and the pair of semiconductor regions by the first semiconductor layer to be adjacent to the first semiconductor layer, an impurity concentration of the third semiconductor layer being higher than the impurity concentration of the first semiconductor layer,
wherein the gate electrode crosses the second semiconductor layer in a width direction of the second semiconductor layer, and
wherein the second semiconductor layer extends in a direction intersecting the crossing direction of the gate electrode.

2. The device according to claim 1, wherein the pair of semiconductor regions are not provided on an upper surface of the second semiconductor layer, and an insulating layer is provided on the upper surface of the second semiconductor layer.

3. The device according to claim 2, wherein:
upper surfaces of the pair of semiconductor regions are formed at the same height as the upper surface of the second semiconductor layer, and
the insulating layer is provided on the upper surfaces of the pair of semiconductor regions.

4. The device according to claim 1, wherein a width of the second semiconductor layer having the fin configuration is not more than 20 nm.

5. The device according to claim 1, wherein:
the first semiconductor layer has the first conductivity type, and
a p-n diode is formed of the second semiconductor layer, the first semiconductor layer, and the third semiconductor layer.

6. The device according to claim 1, wherein:
the first semiconductor layer has a protrusion,
the second semiconductor layer is provided on the protrusion, and
the pair of semiconductor regions extend from the side walls of the second semiconductor layer to side walls of the protrusion.

7. The device according to claim 1, wherein the third semiconductor layer is provided in a region not overlapping the gate electrode, the region being on two sides of the second semiconductor layer in the width direction.

8. The device according to claim 7, wherein the third semiconductor layer is connected to a contact plug in the region.

9. The device according to claim 1, wherein a width of the second semiconductor layer is narrower than a width of the gate electrode.

10. The device according to claim 1, wherein the second semiconductor layer and the pair of semiconductor regions have monocrystalline structures.

11. The device according to claim 1, wherein a ratio of a height of the second semiconductor layer to a width of the second semiconductor layer is greater than 1.

12. The device according to claim 1, wherein lower ends of the pair of semiconductor regions contact the first semiconductor layer.

13. The device according to claim 1, wherein the tunnel junctions are formed at only the side walls of the second semiconductor layer and are not formed at an upper surface of the second semiconductor layer and a lower surface of the second semiconductor layer.

14. The device according to claim 1, wherein the device is normally-off.

15. The device according to claim 1, wherein a potential is applied to the second semiconductor layer and the third semiconductor layer to apply a reverse bias to the tunnel junctions.

* * * * *